US006437585B1

(12) United States Patent
Mickey, III et al.

(10) Patent No.: US 6,437,585 B1
(45) Date of Patent: Aug. 20, 2002

(54) ELECTRICAL CONTACTOR FOR AUTOMATIC TESTING OF CHIPS INCLUDING RF CHIPS

(75) Inventors: Joseph John Mickey, III, Doylestown; Erik Wayne Demarest, Bethlehem, both of PA (US)

(73) Assignee: Anadigics, Inc., Warren, NJ (US)

( * ) Notice: Subject to any disclaimer, the term of this patent is extended or adjusted under 35 U.S.C. 154(b) by 14 days.

(21) Appl. No.: 09/699,179

(22) Filed: Oct. 27, 2000

(51) Int. Cl.[7] ............................. G01R 31/02; H01R 4/58
(52) U.S. Cl. ...................... 324/754; 324/755; 324/758; 439/86
(58) Field of Search ................................ 324/754, 755, 324/761, 758, 688; 439/86, 101

(56) References Cited

U.S. PATENT DOCUMENTS

| | | | |
|---|---|---|---|
| 3,290,756 A | 12/1966 | Dreyer ........................ 29/155.5 |
| 3,906,363 A | 9/1975 | Fowler ........................ 324/158 |
| 4,686,468 A | 8/1987 | Lee et al. .................... 324/158 |
| 4,935,696 A | * 6/1990 | DiPerna ....................... 324/761 |
| 5,090,118 A | 2/1992 | Kwon et al. .................... 29/843 |
| 5,430,385 A | 7/1995 | Hutton et al. ................ 324/754 |
| 5,475,317 A | 12/1995 | Smith .......................... 324/760 |
| 5,698,990 A | 12/1997 | Aussant et al. ............. 324/761 |
| 5,701,085 A | 12/1997 | Malladi et al. .............. 324/754 |
| 5,773,986 A | 6/1998 | Thompson et al. .......... 324/754 |
| 5,828,226 A | 10/1998 | Higgins et al. .............. 324/762 |
| 5,838,161 A | 11/1998 | Akram et al. ................ 324/755 |
| 5,854,558 A | 12/1998 | Motooka et al. ............. 324/754 |
| 5,936,415 A | 8/1999 | Fredrickson ................. 324/754 |
| 5,982,186 A | * 11/1999 | Buschbom ................... 324/755 |
| 6,037,786 A | 3/2000 | Palagonia .................... 324/754 |
| 6,049,217 A | 4/2000 | Viswanath et al. ......... 324/760 |
| 6,054,869 A | 4/2000 | Hutton et al. ................ 324/754 |
| 6,072,322 A | 6/2000 | Viswanath et al. ......... 324/754 |
| 6,081,429 A | 6/2000 | Barrett ........................ 361/767 |
| 6,084,420 A | 7/2000 | Chee ............................ 324/754 |
| 6,099,597 A | 8/2000 | Yap et al. ................... 29/25.01 |
| 6,133,744 A | 10/2000 | Yojima et al. .............. 324/754 |
| 6,188,230 B1 | * 2/2001 | Birk ............................. 324/754 |

* cited by examiner

Primary Examiner—Safet Metjahic
Assistant Examiner—Anjan K. Deb
(74) Attorney, Agent, or Firm—Pennie & Edmonds LLP

(57) ABSTRACT

An electrical contactor for establishing an electrical contact between a chip and a printed circuit board for testing chips comprising a conductive layer and a ground contact pedestal. The ground contact pedestal is preferably press fit and soldered onto a ground layer of the printed circuit board for establishing good ground contact with the chip. In addition, the contactor preferably has a thin profile that does not electrically interfere with sensitive electronics contained within the chip. The contactor also does not use a plastic frame for mounting purposes. Such plastic frames reduce accessibility to the printed circuit board, making fine tuning electronics in the printed circuit board more difficult. Rather, the contactor preferably includes two holes in its conductive layer that mount on dowels in the printed circuit board and is secured to the dowels by two O-rings.

16 Claims, 4 Drawing Sheets

ELECTRICAL CONTACTOR FOR AUTOMATIC TESTING OF CHIPS INCLUDING RF CHIPS

FIELD OF THE INVENTION

The present invention relates generally to an electrical contactor for conducting electrical signals between a chip being tested and a printed circuit board for testing chips.

BACKGROUND OF THE INVENTION

Currently available electrical contactors that interface chips and printed circuit boards that test the chips typically use conductive wires or spheres to conduct electrical signals between the chip and the printed circuit board and to ground the chip on the printed circuit board. Although these wires and spheres may be adequate for conducting electrical signals, they often do not do a good job of grounding the chip under test, especially grounding radio frequency (RF) signals.

Additionally, currently available electrical contactors typically use plastic guide frames that require screws for mounting. The plastic guide frames reduce accessibility to the printed circuit board, making tuning of the electronic components on the printed circuit board difficult. Furthermore, mounting and dismounting electrical contactors having plastic frames and screws is time consuming.

Currently available electrical contactors also typically have large profiles that can electrically interfere with sensitive electronic components contained in the chip and, therefore, can affect the results of chip testing.

There is a need, therefore, for an electrical contactor that can establish a good direct current ground as well as an RF signal ground, does not require a frame that can decrease accessibility to the printed circuit board, mounts and dismounts easily and quickly from the printed circuit board, and has a thin profile to avoid electrically interfering with electronics contained in the chip.

SUMMARY OF THE INVENTION

In accordance with a preferred embodiment of the present invention, the foregoing and other objects and advantages are attained by an electrical contactor for establishing electrical contact between a chip and a printed circuit board for testing chips comprising at least one interconnect that electrically connects at least one chip lead to the printed circuit board and a separate ground contact that grounds the chip through a ground located on the bottom of the chip. The ground contact preferably comprises a block of metal that contacts is shaped to fit in an indentation in a ground layer located beneath the printed circuit board. In addition, the ground contact may further comprise solder applied on top of the block of metal for establishing a good contact with the ground on the chip. Moreover, the ground contact preferably also functions as a solid stop to prevent a chip being plunged on the electrical contactor during testing from damaging the electrical contactor.

The electrical contactor preferably further comprises an interposer, wherein at least one interconnect is fabricated on the interposer. The at least one interconnect preferably comprises an abrasive material that scratches open the surface of a chip lead, exposing conductive material to establish good electrical contact.

The electrical contactor preferably further comprises a conductive elastomer bonded to and below the interposer. The conductive elastomer preferably comprises an array of wires embedded in an elastomer wherein the wires carry electrical signals between the at least one interconnect and the printed circuit board. The elastomer absorbs the compressional forces imparted when the chip is plunged on the electrical contactor, thus protecting the printed circuit board. Preferably, the wires are parallel to one another and oriented at a slanted angle.

The bonded interposer and conductive elastomer preferably contain at least one hole for mounting the contactor on at least one dowel on the printed circuit board. An O-ring preferably secures the bonded interposer and conductive elastomer layer to the at least one dowel on the printed circuit board. In addition, the bonded interposer and conductive elastomer preferably have a thin profile to avoid electrically interfering with electronic components contained within the chip being tested.

BRIEF DESCRIPTION OF THE DRAWINGS

For a more complete understanding of the present invention, reference is made to the following Detailed Description taken in conjunction with the accompanying drawings in which.

DETAILED DESCRIPTION OF THE PREFERRED EMBODIMENTS

Figure 1:
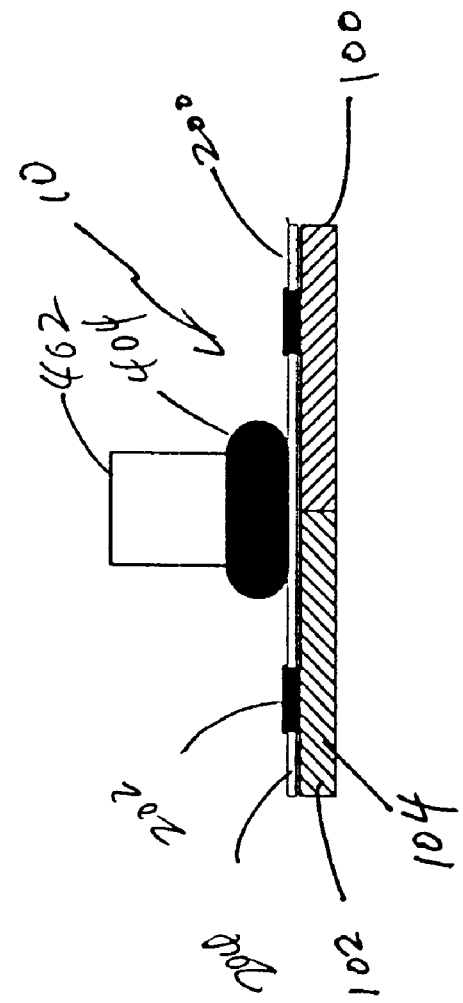
FIG. 1 is a side view of an electrical contactor in accordance with a preferred embodiment of the present invention that is mounted on dowels in a printed circuit board.
Figure 2:
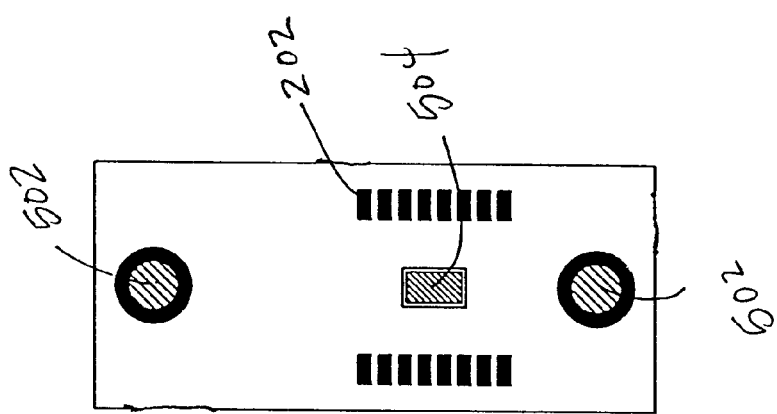
FIG. 2 is a top view of the electrical contactor of FIG. 1.
Figure 3:
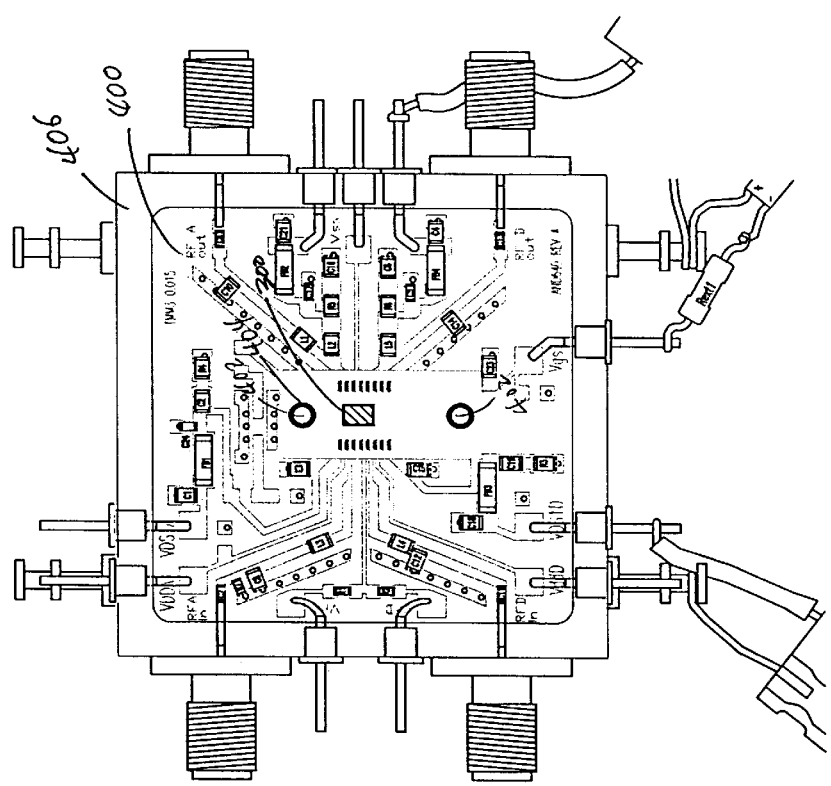
FIG. 3 is a top view of the electrical contactor of FIG. 1 mounted on a printed circuit board for testing chips.
Figure 4:
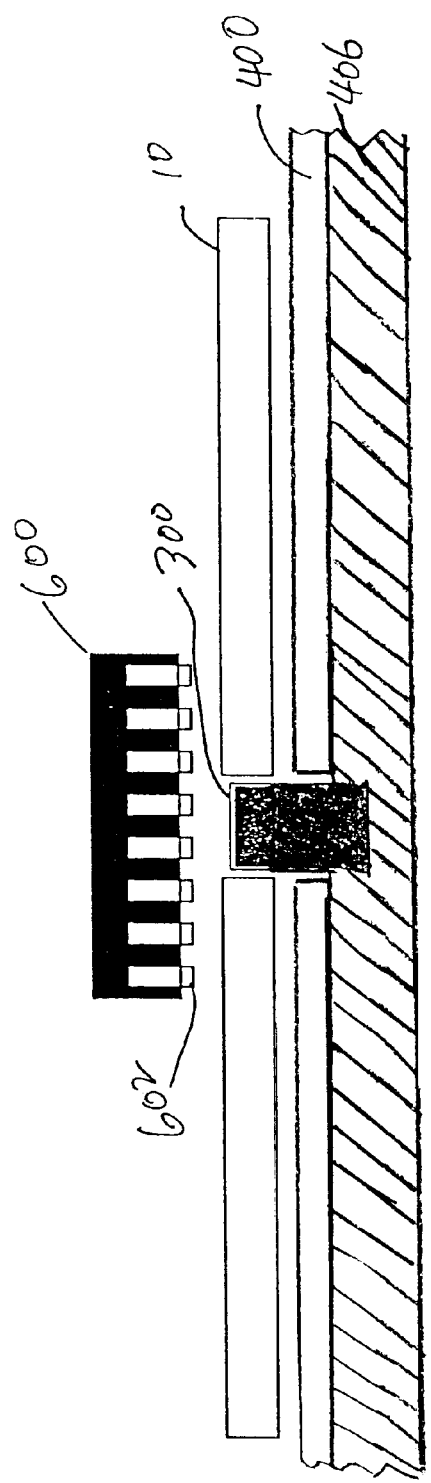
FIG. 4 is a side view of a ground contact pedestal mounted within the electrical contactor of FIG. 1, illustrating a chip being plunged on the electrical contactor.

FIGS. 1–4 illustrate a preferred embodiment of an electrical contactor according to the present invention. As shown in FIGS. 1 and 4, electrical contactor 10 preferably comprises a conductive elastomer 100, an interposer 200, and a ground contact pedestal 300.

As shown in FIG. 1, conductive elastomer 100 preferably comprises elastomer 104 and an array of wires 102 embedded in elastomer 104. Wires 102 are preferably parallel to one another and conduct electrical signal across the thickness of conductive elastomer 100. Elastomer 104 makes conductive elastomer 100 compressible, which is important for protecting printed circuit board 400, shown in FIG. 3, as described in further detail below. The preferred conductive elastomer is the Shin-etsu type MT conductive elastomer, which includes parallel gold plated brass wires embedded in silicon rubber.

Wires 102 are preferably oriented at a slant, as illustrated in FIG. 1. The preferred angle of the slant is 65° from the horizontal. When conductive elastomer 100 is compressed, wires 102 are pressed on their sides towards one another while elastomer 104 absorbs most of the compressional forces. Orienting wires at a slant prolongs the life of wires 102 since wires 102 experience most of the compressional forces distributed along their sides. If wires 102 are oriented perpendicular to the horizontal, wires 102 would receive most of the compressional forces that are concentrated at particular points in the wires, and significantly decreasing the compressibility of conductive elastomer 100.

Conductive elastomer 100 may include two strips of conductive elastomer placed together in the fashion shown in FIG. 1 to prevent wires 102 from inadvertently grounding chip leads 602 (FIG. 4) when chip 600 is mounted on electrical contactor 10. In particular, when the wires are in this configuration, they connect ground on printed circuit board 400 to the center of chip 600 and direct ground away from interconnects 202.

Turning now to FIGS. 1 and 2, the preferred thickness of conductive elastomer 100 is 30 mils. Three holes 502, 504 are cut into the conductive elastomer 100. Two holes 502 are cut at opposite ends of the conductive elastomer 100 for mounting electrical contactor 10 onto dowels 402 on the printed circuit board, and one center hole 504 is cut to accommodate ground contact pedestal 300 (shown in FIG. 4).

Interposer 200 preferably includes a circuit printed on a polyimide film substrate 204. The circuit preferably includes a plurality of interconnects 202 which are plated through the thickness of polyimide film substrate 204 for electrically connecting leads 602 of chip 600 (FIG. 4) to wires 102 of conductive elastomer 100 when chip 600 (FIG. 4) is mounted on electrical contactor 10. Interconnects 202 are preferably particle interconnects that include small diamonds embedded in nickel that is plated with gold. The preferred particle interconnect 202 is one made by Exatron. The embedded diamonds scratch the surface of chip leads 602 as chip 600 (FIG. 4) is plunged on electrical contactor 10 to expose fresh conductive material in leads 602, establishing good electrical conduction between leads 602 and interconnects 202 during chip testing. In addition, the preferred polyimide film substrate 204 material is Kapton, although other suitable interposer materials may be used such as FR4, Upilex S, R Flex Crystal 7200, and R Flex 1100 manufactured by Rogers Corporation.

Like conductive elastomer 100, interposer 200 preferably has a thin profile, preferably 2–3 mils thick. Also, like conductive elastomer 100, three holes 502, 504 are cut in interposer 200. Two holes 502 are cut at opposite ends of interposer 200 for mounting electrical contactor 10 onto dowels in printed circuit board and one center hole 504 is cut to accommodate ground contact pedestal 300.

Conductive elastomer 100 is preferably bonded to interposer 200 using an adhesive, such as Loctite 454. The three holes cut in both layers 100, 200 are aligned and the adhesive is applied such that it does not interfere with the conductivity between interconnects 202 of interposer 200 and wires 102 of conductive elastomer 100. The combined layers 100, 200 preferably have a thickness of about 32–33 mils. Due to the thin profile of layers 100, 200, holes 502 cut at the ends of the contactor are preferably strengthened by metallization, which prevents tearing around the holes when the electrical contactor 10 is mounted on the printed circuit board. The metallization preferably comprises copper with gold plating over nickel.

Turning now to FIGS. 3 and 4, ground contact pedestal 300 preferably comprises a block of brass press fitted and soldered to ground layer 406 of printed circuit board 400. The press fitting and soldering establish a good ground contact between ground contact pedestal 300 and printed circuit board ground layer 406. The printed circuit board ground layer 406 comprises a block of metal located at the bottom of the printed circuit board. An indentation is machined in the block of metal and a hole is cut in printed circuit board 400 over the indentation such that ground contact pedestal 300 can be press fitted into the indentation through the hole. Solder is applied to the top of ground contact pedestal 300 for establishing good ground contact with ground of the chip being tested. Solder should be reapplied regularly to maintain good electrical contact characteristics. The thickness of ground contact pedestal 300 should be such that when chip 600 is plunged down on electrical contactor 10, ground contact pedestal 300 acts as a solid stop to prevent chip 600 from excessively compressing contactor 10, which may bend chip leads 602 and damage contactor 10.

As shown in FIGS. 1, 2, and 3, electrical contactor 10 is preferably mounted onto printed circuit board 400 by sliding metallized holes 502 over dowels 402. Center hole 504 of electrical contactor 10 preferably slides over ground contact pedestal 300 press fitted and soldered to printed circuit board ground layer 406. Electrical contactor 10 is preferably secured to printed circuit board 400 by sliding O-rings 404 down dowels 402. This method of mounting electrical contactor 10 onto printed circuit board 400 permits easy mounting and removal of electrical contactor 10 during changeover or initial set-up, resulting in reduced down time during chip testing. In addition, because bulky mounting mechanisms such as plastic mounting frames are not used, printed circuit board 400 is more accessible to chip testors for fine tuning electronic components on printed circuit board 400.

In operation, chip 600 is plunged down on electrical contactor 10 for chip testing. Chip leads 602 make electrical contact with interconnects 202 while the ground located at the bottom of chip 600 makes contact with ground contact pedestal 300. Preferably, as described above, small diamonds within interconnects 202 scratch open surfaces of chip leads 602 to expose fresh conductive material, establishing a good electrical connection between chip leads 602 and interconnects 202. In addition, malleable solder on top of ground contact pedestal 300 conforms to the surface of the ground of chip 600 to ensure good ground contact.

Besides grounding chip 600, ground contact pedestal 300 also serves as a solid stop to prevent chip 600 from plunging too close to electrical contactor 10, which can cause chip leads to bend and damage electrical contactor 10. Preferably, ground contact pedestal 300 allows some compression of electrical contactor 10, preferably about 4 mils, to ensure solid lead 602 contact with interconnects 202. Elastomer 104 of conductive elastomer 100 absorbs residual compressional forces caused by chip 600, protecting printed circuit board 400. Interposer 200 prevents debris from contaminating conductive elastomer 100, prolonging electrical contactor 10's life.

After establishing electrical and ground contact with printed circuit board 400 through electrical contactor 10, chip testing commences. Electrical signals are exchanged between printed circuit board 400 and chip 600 through electrical contactor 10. Ground contact pedestal 300 provides DC ground as well as RF signal ground for chip 600, if chip 600 is an RF device. Since chip 600 can contain finely-tuned and sensitive electronic components, as radio frequency devices often do, it is desirable for contactor 10 to cause minimal electrical interference with chip 600. Contactor 10 achieves this result due to its thin profile which does not significantly interfere with incoming radio frequency signals and does not contain much signal-carrying metallic material that can interfere with fine tuned electronics within the chip being tested.

It should be noted that the disclosed embodiments can be modified by a person skilled in the art without deviating from the scope of the present invention. For example, conductive elastomer 100 may include just one piece of wire-embedded elastomer material, as long as chip leads 602 are not inadvertently grounded by the ground of printed circuit board 400. In addition, wires 102 may be oriented at various angles as long as they conduct electricity across the thickness of conductive elastomer 100. Also, abrasive materials other than diamonds may be embedded in interconnects 202. Furthermore, although brass is the preferred metal for ground contact pedestal 300 because it is easy to machine, other metals such as aluminum, copper, and gold may also be used.

While the invention has been described in conjunction with specific embodiments, it is evident that numerous alternatives, modifications, and variations will be apparent to those skilled in the art in light of the forgoing descriptions. The scope of this invention is defined only by the following claims.

What is claimed is:

1. An electrical contactor for establishing an electrical connection between a chip and a printed circuit board for testing chips comprising:
   a. a conductive elastomeric layer, having a hole, capable of connecting at least one chip lead to the printed circuit board; and
   b. a ground contact comprising a block of metal positioned within the hole in said conductive elastomeric layer capable of connecting a ground located on the bottom of the chip to ground layer of printed circuit board and adapted to be press fitted onto the printed circuit board.

2. The electrical contactor according to claim 1, wherein said ground contact further comprises solder applied on top of said block of metal.

3. The electrical contactor according to claim 1, wherein said ground contact is a solid stop that prevents the chip from damaging the conductive elastomeric layer when the chip is plunged on the electrical contactor.

4. The electrical contactor according to claim 1, wherein said conductive elastomeric layer has a thin profile that does not significantly electrically interfere with electronic components contained within chip being tested.

5. The electrical contactor according to claim 1, wherein said conductive elastomeric layer contains at least one mounting hole for mounting on at least one dowel in the printed circuit board.

6. The electrical contactor according to claim 5, further comprising at least one O-ring capable of securing said conductive elastomeric layer to the at least one dowel on the printed circuit board.

7. The electrical contactor according to claim 1, wherein said conductive elastomeric layer comprises a conductive elastomer.

8. The electrical contactor according to claim 7, wherein said conductive elastomer comprises an elastomer and an array of wires embedded in the elastomer wherein said wires carry electrical signals across the thickness of said elastomer and said elastomer absorbs compressional forces.

9. The electrical contactor according to claim 8, wherein said array of wires are parallel to one another.

10. The electrical contactor according to claim 9, wherein said array of wires are oriented at a slanted angle.

11. The electrical contactor according to claim 7, wherein said conductive elastomeric layer further comprises an interposer.

12. The electrical contactor according to claim 11, wherein said conductive elastomer is bonded to and below said interposer.

13. The electrical contactor according to claim 11, wherein at least one interconnect is fabricated on said interposer.

14. The electrical contactor according to claim 13, wherein said at least one interconnect comprises an abrasive material.

15. An electrical contactor for establishing an electrical contact between a chip and a printed circuit board for testing chip comprising:
   a. a conductive layer capable of connecting at least one chip lead to the printed circuit board, wherein said conductive layer has at least one hole for mounting on a dowel in the printed circuit board; and
   b. at least one O-ring capable of securing said conductive layer on the printed circuit board.

16. An electric contactor of claim 15, wherein said conductive layer does not require a frame for mounting on the printed circuit board.

* * * * *